US010685818B2

(12) United States Patent
Dickinson (10) Patent No.: US 10,685,818 B2
(45) Date of Patent: *Jun. 16, 2020

(54) PLASMA ABATEMENT TECHNOLOGY UTILIZING WATER VAPOR AND OXYGEN REAGENT

(71) Applicant: Applied Materials, Inc., Santa Clara, CA (US)

(72) Inventor: Colin John Dickinson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/110,803

(22) Filed: Aug. 23, 2018

(65) Prior Publication Data

US 2018/0366307 A1 Dec. 20, 2018

Related U.S. Application Data

(63) Continuation of application No. 15/884,028, filed on Jan. 30, 2018.

(Continued)

(51) Int. Cl.
*H01J 37/32* (2006.01)
*B01D 53/68* (2006.01)
*B01D 53/32* (2006.01)

(52) U.S. Cl.
CPC ........ *H01J 37/32844* (2013.01); *B01D 53/32* (2013.01); *B01D 53/68* (2013.01);
(Continued)

(58) Field of Classification Search
None
See application file for complete search history.

(56) References Cited

U.S. PATENT DOCUMENTS 4,139,762 A 2/1979 Pohrer et al.
5,758,680 A 6/1998 Kaveh et al.
(Continued)

FOREIGN PATENT DOCUMENTS

JP 2007-232308 A 9/2007
JP 2016-093792 A 5/2016
(Continued)

OTHER PUBLICATIONS

Office Action for Taiwan Application No. 107103581 dated Mar. 7, 2019.
(Continued)

*Primary Examiner* — Shamim Ahmed
(74) *Attorney, Agent, or Firm* — Patterson + Sheridan, LLP (57) ABSTRACT

Implementations of the present disclosure relate to systems and techniques for abating F-gases present in the effluent of semiconductor manufacturing processes. In one implementation, a water and oxygen delivery system for a plasma abatement system is provided. The water and oxygen delivery system comprises a housing that includes a floor and a plurality of sidewalls that define an enclosed region. The water and oxygen delivery system further comprises a cylindrical water tank positioned on the floor, wherein a longitudinal axis of the cylindrical water tank is parallel to a plane defined by the floor and a length of the water tank is 1.5 times or greater than the diameter of the cylindrical water tank. The water and oxygen delivery system further comprises a flow control system positioned within the housing above the cylindrical water tank.

20 Claims, 4 Drawing Sheets

Related U.S. Application Data (60) Provisional application No. 62/457,036, filed on Feb. 9, 2017.

(52) U.S. Cl.
CPC .. *H01J 37/32862* (2013.01); *B01D 2251/102* (2013.01); *B01D 2257/204* (2013.01); *B01D 2257/2066* (2013.01); *B01D 2258/0216* (2013.01); *B01D 2259/818* (2013.01); *H01J 2237/334* (2013.01); *H01J 2237/3321* (2013.01); *Y02C 20/30* (2013.01)

(56) References Cited

U.S. PATENT DOCUMENTS

| | | | |
|---|---|---|---|
| 6,361,706 | B1 | 3/2002 | Gabriel |
| 6,423,284 | B1* | 7/2002 | Arno .................. B01D 53/68 423/240 R |
| 6,576,573 | B2 | 6/2003 | Arno |
| 6,888,040 | B1* | 5/2005 | Shufflebotham ....... B01D 53/70 423/240 R |
| 7,547,005 | B2 | 6/2009 | Tomasel et al. |
| 8,747,762 | B2 | 6/2014 | Dickinson et al. |
| 9,333,460 | B2 | 5/2016 | Radoiu |
| 9,597,634 | B2 | 3/2017 | Dickinson et al. |
| 2002/0111045 | A1 | 8/2002 | Arno |
| 2003/0010364 | A1 | 1/2003 | Lerner et al. |
| 2004/0001787 | A1 | 1/2004 | Porshnev et al. |
| 2005/0250347 | A1 | 11/2005 | Bailey et al. |
| 2007/0086931 | A1 | 4/2007 | Raoux et al. |
| 2007/0095282 | A1 | 5/2007 | Moon et al. |
| 2007/0169889 | A1 | 7/2007 | Clark et al. |
| 2007/0187850 | A1 | 8/2007 | Tomasel et al. |
| 2007/0197039 | A1 | 8/2007 | Puech |
| 2008/0102011 | A1 | 5/2008 | Moalem et al. |
| 2008/0131958 | A1* | 6/2008 | Remmereit .............. C02F 3/34 435/290.1 |
| 2008/0163900 | A1 | 7/2008 | Richards et al. |
| 2008/0202588 | A1 | 8/2008 | Gold et al. |
| 2008/0264453 | A1 | 10/2008 | Taylor |
| 2009/0183684 | A1 | 7/2009 | Radoiu |
| 2009/0216061 | A1 | 8/2009 | Clark et al. |
| 2009/0314626 | A1 | 12/2009 | Moine et al. |
| 2010/0258510 | A1 | 10/2010 | Hooshdaran et al. |
| 2011/0061685 | A1 | 3/2011 | Sommers et al. |
| 2011/0135552 | A1* | 6/2011 | Dickinson .............. B01D 53/32 423/235 |
| 2013/0064730 | A1 | 3/2013 | Nakayama et al. |
| 2015/0129131 | A1 | 5/2015 | Li et al. |
| 2015/0202566 | A1* | 7/2015 | Swann .................. B01D 53/68 423/240 R |
| 2015/0251133 | A1 | 9/2015 | Cox et al. |
| 2015/0252473 | A1 | 9/2015 | Dickinson |
| 2015/0314233 | A1* | 11/2015 | Hur .................. H01J 37/32091 422/168 |
| 2016/0045841 | A1* | 2/2016 | Kaplan ................ B01J 19/0093 429/49 |
| 2016/0077508 | A1 | 3/2016 | Schauer |
| 2016/0089630 | A1 | 3/2016 | Dickinson et al. |
| 2016/0166868 | A1* | 6/2016 | Dickinson .......... H01J 37/32844 588/313 |
| 2017/0027049 | A1 | 1/2017 | Wang et al. |
| 2017/0173521 | A1 | 6/2017 | Dickinson et al. |
| 2017/0297066 | A1 | 10/2017 | Dickinson |
| 2018/0015413 | A1 | 1/2018 | Yamada et al. |
| 2019/0282956 | A1 | 9/2019 | Dickinson et al. |

FOREIGN PATENT DOCUMENTS

| | | |
|---|---|---|
| TW | 200729273 A | 8/2007 |
| TW | 200738322 A | 10/2007 |
| TW | 200848664 A | 12/2008 |
| TW | 201632224 A | 9/2016 |

OTHER PUBLICATIONS

Search Report for Taiwan Application No. 107103581 dated Mar. 6, 2019.

International Search Report and Written Opinion for International Application No. PCT/US2018/015982 dated May 15, 2018.

* cited by examiner

FIG. 4

PLASMA ABATEMENT TECHNOLOGY UTILIZING WATER VAPOR AND OXYGEN REAGENT

CROSS-REFERENCE TO RELATED APPLICATIONS

This application is a continuation of U.S. patent application Ser. No. 15/884,028, filed Jan. 30, 2018, which claims benefit of U.S. Provisional Patent Application Ser. No. 62/457,036, filed Feb. 9, 2017, both of which are incorporated herein by reference in their entirety.

BACKGROUND

Field

Implementations of the present disclosure generally relate to abatement for semiconductor processing equipment. More particularly, implementations of the present disclosure relate to systems and techniques for abating fluorinated greenhouse gases (F-gases) (e.g., hydrofluorocarbons (HFCs), perfluorocarbons (PFCs), and sulfur hexafluoride ($SF_6$)) present in the effluent of semiconductor manufacturing processes.

Description of the Related Art

Effluent produced during semiconductor manufacturing processes includes many compounds, which is abated or treated before disposal, due to regulatory requirements and environmental and safety concerns. Among these compounds are the F-gases and halogen containing compounds, which are used, for example, in etching or cleaning processes.

F-gases, such as $CF_4$, $C_2F_6$, $NF_3$ and $SF_6$, are commonly used in the semiconductor and flat panel display manufacturing industries, for example, in dielectric layer etching and chamber cleaning. Following the manufacturing or cleaning process, there is typically a residual content of the F-gases in the effluent gas stream pumped from the process tool. F-gases are difficult to remove from the effluent stream, and their release into the environment is undesirable because they are known to have relatively high greenhouse activity. Remote plasma sources (RPS) or in-line plasma sources (IPS) have been used for abatement of F-gases and other global warming gases.

The design of current abatement technology for abating F-gases utilizes water vapor alone. Water vapor provides excellent destruction capability for F-gases, but in some applications, solid particles are generated in the plasma source, exhaust line and pump downstream of the plasma source. Thus, an improved abatement process is needed.

SUMMARY

Implementations of the present disclosure generally relate to abatement for semiconductor processing equipment. More particularly, implementations of the present disclosure relate to systems and techniques for abating F-gases present in the effluent of semiconductor manufacturing processes. In one implementation, a water and oxygen delivery system for a plasma abatement system is provided. The water and oxygen delivery system comprises a housing that includes a floor and a plurality of sidewalls that define an enclosed region. The water and oxygen delivery system further comprises a cylindrical water tank positioned on the floor, wherein a longitudinal axis of the cylindrical water tank is parallel to a plane defined by the floor and a length of the water tank is 1.5 times or greater than the diameter of the cylindrical water tank. The water and oxygen delivery system further comprises a flow control system positioned within the housing above the cylindrical water tank.

In another implementation, an abatement system is provided. The abatement system comprises a water and oxygen delivery system and a plasma source coupled with the water and oxygen delivery system via a conduit. The water and oxygen delivery system comprises a housing that includes a floor and a plurality of sidewalls that define an enclosed region. The water and oxygen delivery system further comprises a cylindrical water tank positioned on the floor, wherein a longitudinal axis of the cylindrical water tank is parallel to a plane defined by the floor and a length of the water tank is 1.5 times or greater than the diameter of the cylindrical water tank. The water and oxygen delivery system further comprises a flow control system positioned within the housing above the cylindrical water tank.

In yet another implementation, a vacuum processing system is provided. The vacuum processing system comprises a processing chamber, a vacuum source, a foreline coupling the processing chamber with the vacuum source, and an abatement system coupled with the foreline between the processing chamber and the vacuum source. The abatement system comprises a water and oxygen delivery system and a plasma source coupled with the water and oxygen delivery system via a conduit. The water and oxygen delivery system comprises a housing that includes a floor and a plurality of sidewalls that define an enclosed region. The water and oxygen delivery system further comprises a cylindrical water tank positioned on the floor, wherein a longitudinal axis of the cylindrical water tank is parallel to a plane defined by the floor and a length of the water tank is 1.5 times or greater than the diameter of the cylindrical water tank. The water and oxygen delivery system further comprises a flow control system positioned within the housing above the cylindrical water tank.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes systems and techniques for abating fluorinated greenhouse gases (F-gases) present in the effluent of semiconductor manufacturing processes. Certain details are set forth in the following description and in FIGS. 1-4 to provide a thorough understanding of various implementations of the disclosure. Other details describing well-known structures and systems often associated with abatement systems and flow control hardware are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a pre-pump abatement process that can be carried out using a zero-footprint abatement system, such as a zero-footprint abatement system available from Applied Materials, Inc. of Santa Clara, Calif. Other tools capable of performing pre-pump abatement processes may also be adapted to benefit from the implementations described herein. In addition, any system enabling the pre-pump abatement processes described herein can be used to advantage. The apparatus description described herein is illustrative and should not be construed or interpreted as limiting the scope of the implementations described herein.

Implementations disclosed herein include a plasma abatement process and system that takes effluent from a processing chamber, such as a deposition chamber, an etch chamber or other vacuum processing chamber, and reacts the effluent with water vapor reagent and/or an oxygen-containing gas within a plasma source placed in a foreline by injecting the water vapor reagent and/or the oxygen-containing gas into the foreline or the plasma source. The materials present in the effluent as well as the water vapor reagent and/or oxygen-containing gas are energized by the plasma source, converting the materials into gas species such as HF that is readily scrubbed by typical water scrubbing abatement technology. In some implementations, the water vapor reagent and the oxygen-containing gas are simultaneously injected into the foreline or the plasma source. In some implementations, the oxygen-containing gas is periodically injected into the foreline or the plasma source while the water vapor injection is temporarily stopped. By removing the hydrogen radical effluent provided by the water vapor, the use of oxygen enables the presence of higher concentrations of fluorine radicals to reduce or avoid the generation of solid particles. Thus, the abatement system and process provide good destruction removal efficiency (DRE) with minimized solid particle generation.

Implementations described herein further provide a module that provides for delivery of water vapor and oxygen, either simultaneously, or sequentially. The oxygen and water vapor may be provided by a mass flow controller ("MFC") or by alternative techniques using one or more needle valves for flow control. The module includes a water tank to allow boiling of the water vapor to feed the water vapor MFC or flow control valve. The water tank is designed for low profile configuration to allow space optimization of the combined water and oxygen delivery system. This low profile configuration utilizes a horizontal water tank, which maximizes the boiling surface area. In some implementations, the low profile configuration further includes a low profile level tree float design to allow level measurement but with low overall vertical height requirement.

Implementations described herein further provide methods for delivery of water vapor and oxygen within an abatement system. In some implementations, a water vapor and oxygen ratio is determined by establishing a chosen water vapor only flow rate (e.g., X sccm) and a chosen oxygen only flow rate (e.g., Y sccm) and then applying a "balanced" flow method to vary the water vapor and oxygen in between. For example, a "lean water" configuration at "25% water vapor" would be equal to a mixture of $0.25 \times X + 0.75 \times Y$, a "lean oxygen" setting would be $0.75 \times X + 0.25 \times Y$, and a "balanced mixture" would be $0.5 \times X + 0.5 \times Y$.

Figure 1:
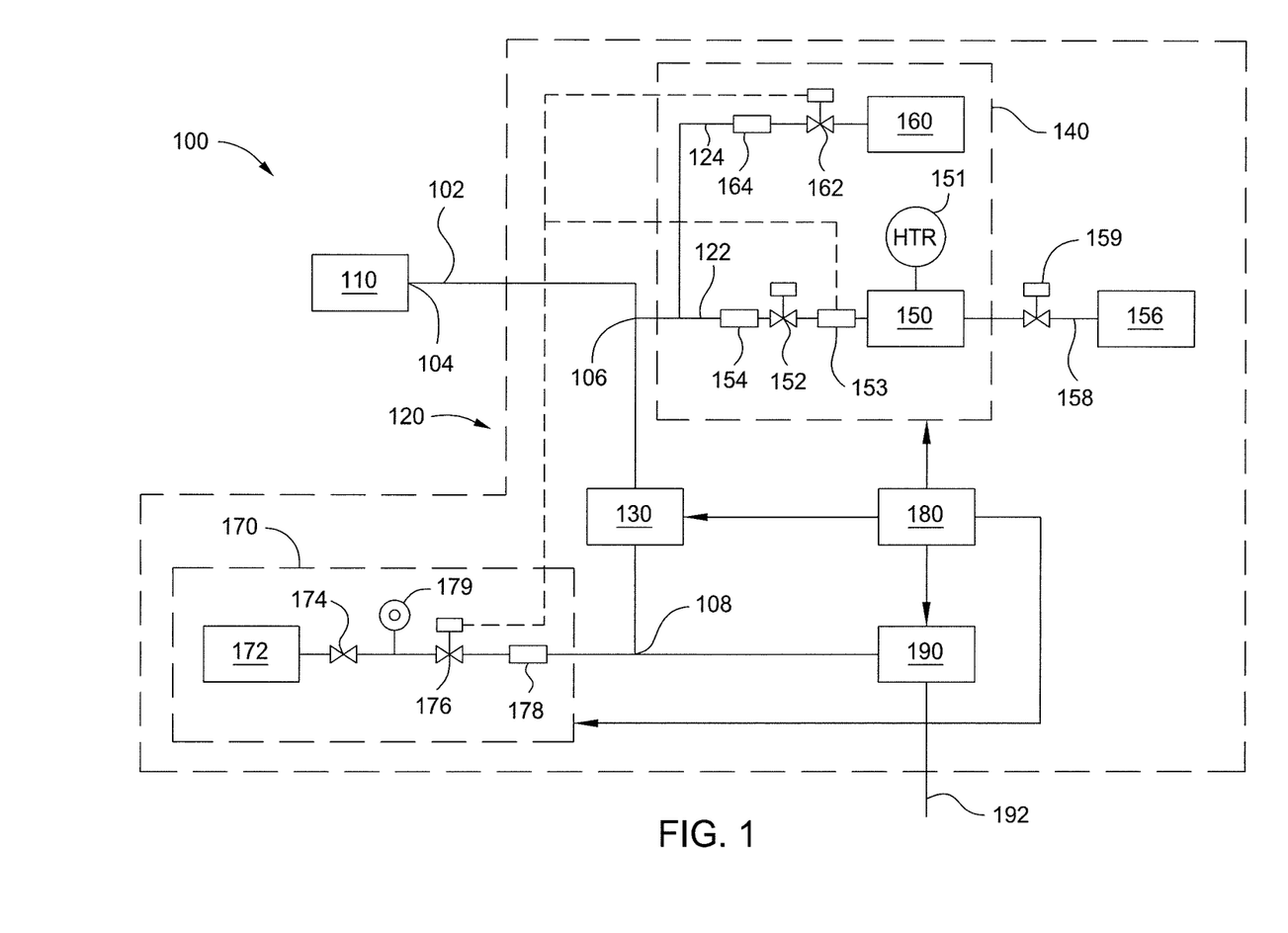
FIG. 1 is a schematic diagram of a processing system according to one or more implementations of the present disclosure.

FIG. 1 depicts a schematic diagram of a processing system 100 in accordance with the implementations disclosed herein. As shown in FIG. 1, the processing system 100 includes a processing chamber 110 coupled with an abatement system 120. The processing chamber 110 has a chamber exhaust port 104 coupled to a foreline 102 of the abatement system 120. A throttle valve (not shown) may be placed proximate the chamber exhaust port 104 for controlling the pressure inside the processing chamber 110. At least a first injection port 106 and a second injection port 108 may be formed in the foreline 102. The abatement system 120 further includes a vacuum source 190 coupled to a second end of the foreline 102. A plasma source 130 is coupled in the foreline 102 at a location between the first injection port 106 and the vacuum source 190.

The processing chamber 110 may be, for example, a processing chamber for carrying out a deposition process, an etching process, an annealing process or a cleaning process, among others. Representative chambers for carrying out a deposition process include deposition chambers, such as, for example, plasma enhanced chemical vapor deposition (PECVD) chambers, chemical vapor deposition (CVD) chambers, or physical vapor deposition (PVD) chambers. In some implementations, the deposition process may be one that deposits dielectrics, such as silicon dioxide, ($SiO_2$), silicon nitride ($SiN_x$), silicon oxynitride (SiON), crystalline silicon, a-Si, doped a-Si, fluorinated glass (FSG), phosphorous doped glass (PSG), boron-phosphorous doped glass (BPSG), carbon-doped glass, and other low-k dielectrics, such as polyimides and organosiloxanes. In other implementations, the deposition process may be one that deposits metals, metal oxides, or metal nitrides, such as, for example, titanium, titanium dioxide, tungsten, tungsten nitride, tantalum, tantalum nitride, tantalum carbide, aluminum, aluminum oxide, aluminum nitride, ruthenium, or cobalt. In addition, metal alloys may be deposited, such as lithium-phosphorous-oxynitride, lithium-cobalt, and many others. The deposition process performed in the processing chamber 110 may be plasma assisted. For example, the process performed in the processing chamber 110 may be a plasma etch process for etching silicon-based material. In one implementation, the processing chamber 110 is a plasma enhanced chemical vapor deposition (PECVD) chamber for depositing a silicon-based material.

Foreline 102 serves as a conduit that routes effluent leaving the processing chamber 110 to the abatement system 120. The effluent may contain material, which is undesirable for release into the atmosphere or may damage downstream equipment, such as vacuum pumps. For example, the effluent may contain compounds from a dielectric deposition process or from a metal deposition process.

Examples of silicon-containing materials, which may be present in the effluent, include, for example, silicon tetrachloride ($SiCl_4$) and/or silicon tetrafluoride ($SiF_4$).

As shown, the abatement system 120 includes the plasma source 130, a reagent delivery system 140, a foreline gas injection kit 170, a controller 180, and the vacuum source 190. Foreline 102 provides effluent leaving the processing chamber 110 to the plasma source 130. The plasma source 130 may be any plasma source coupled to the foreline 102 suitable for generating a plasma therein. For example, the plasma source 130 may be a remote plasma source, an in-line plasma source, or other suitable plasma source for generating a plasma within the foreline 102 or proximate the foreline 102 for introducing reactive species into the foreline 102. The plasma source 130 may be, for example, an inductively coupled plasma source, a capacitively coupled plasma source, a direct current plasma source, or a microwave plasma source. The plasma source 130 may further be a magnetically enhanced plasma source of any kind described above.

A reagent delivery system 140 may also be coupled with the first injection port 106 via a first conduit 122. The reagent delivery system 140 delivers one or more reagents, such as abating reagents, to the foreline 102 upstream of the plasma source 130. In an alternative implementation, the reagent delivery system 140 may be coupled directly to the plasma source 130 for delivering reagents directly into the plasma source 130. The reagent delivery system 140 includes a first reagent source 150 coupled to the foreline 102 (or the plasma source 130) via the first conduit 122. In some implementations, the first reagent source 150 is a low-pressure boiler, and a liquid abating agent, such as liquid water, is disposed in the low-pressure boiler. Alternatively, the first reagent source 150 may be a flash evaporator capable of turning liquid water into water vapor. The first reagent source 150 includes a heater 151 for heating water to form an abating reagent, such as water vapor or steam. An abating reagent in the form of a vapor, such as a water vapor, is injected into the foreline 102 via the first injection port 106. A level sensor may be located in the abating reagent delivery system for providing a signal to the controller 180 that selectively opens a fill valve (not shown) to maintain the water level inside the first reagent source 150.

The first reagent source is coupled with a water source 156 via a third conduit 158 for supplying water to the first reagent source 150. One or more valves 159 may be positioned along the third conduit 158 for controlling the flow of water from the water source 156 to the first reagent source 150.

One or more valves may be positioned along the first conduit 122 between the first reagent source 150 and the first injection port 106. For example, in some implementations, a valve scheme may include a two-way control valve 152, which functions as an on/off switch for controlling the flow of the one or more reagents from the first reagent source 150 into the foreline 102, and a flow control device 154, which controls the flow rates of the first reagent source 150 into the foreline 102. The flow control device 154 may be disposed between the foreline 102 and the two-way control valve 152. The two-way control valve 152 may be any suitable control valve, such as a solenoid valve, pneumatic valve, needle valve or the like. The flow control device 154 may be any suitable active or passive flow control device, such as a fixed orifice, mass flow controller, needle valve or the like. In some implementations, a heater 153 is positioned along the first conduit for maintaining the reagent supplied from the first reagent source 150 in vapor form. In some implementations, the heater 153 is positioned along the first conduit 122 in between the two-way control valve 152 and the first reagent source 150.

A representative volatilizing abating reagent that may be delivered by the first reagent source 150 includes, for example, $H_2O$. $H_2O$ may be used when abating effluent containing, for example, $CF_4$ and/or other materials. In some implementations, the volatilizing abating reagents may be consumed by the compounds of the effluent, and therefore, may not be considered catalytic.

The reagent delivery system 140 further includes a second reagent source 160 coupled to the foreline 102 (or the plasma source 130) via a second conduit 124 coupled with the first conduit 122. One or more valves are positioned along the second conduit 124 between the second reagent source 160 and the first conduit 122 for controlling the flow of the second reagent. For example, in some implementations, a valve scheme may include a two-way control valve 162, which functions as an on/off switch for controlling the flow of the one or more reagents from the second reagent source 160 into the foreline 102, and a flow control device 164, which controls the flow rates of the second reagent source 160 into the foreline 102. The flow control device 164 may be disposed between the foreline 102 and the two-way control valve 162. The two-way control valve 162 may be any suitable control valve, such as a solenoid valve, pneumatic valve, needle valve or the like. The flow control device 164 may be any suitable active or passive flow control device, such as a fixed orifice, mass flow controller, needle valve or the like.

An oxygen-containing gas may be delivered by the second reagent source 160, for example, $O_2$. The $O_2$ may be used when abating effluent containing, for example, $CF_4$ and/or other materials. A hydrogen-containing gas may be used in conjunction with $O_2$ in one or more implementations.

The foreline gas injection kit 170 may also be coupled to the foreline 102 upstream or downstream of the plasma source 130 (downstream depicted in FIG. 1). The foreline gas injection kit 170 may controllably provide a foreline gas, such as nitrogen ($N_2$), argon (Ar), or clean dry air, into the foreline 102 to control the pressure within the foreline 102. The foreline gas injection kit 170 may include a foreline gas source 172 followed by a pressure regulator 174, further followed by a control valve 176, and even further followed by a flow control device 178. The pressure regulator 174 sets the gas delivery pressure set point. The control valve 176 turns on and off the gas flow. The control valve 176 may be any suitable control valve, such as discussed above for the two-way control valve 152. The flow control device 178 provides the flow of gas specified by the set point of pressure regulator 174. The flow control device 178 may be any suitable flow control device, such as discussed above for the flow control devices 154 and 164.

In some implementations, the foreline gas injection kit 170 may further include a pressure gauge 179. The pressure gauge 179 may be disposed between the pressure regulator 174 and the flow control device 178. The pressure gauge 179 may be used to measure pressure in the foreline gas injection kit 170 upstream of the flow control device 178. The measured pressure at the pressure gauge 179 may be utilized by a control device, such as a controller 180, discussed below, to set the pressure upstream of the flow control device 178 by controlling the pressure regulator 174.

In some implementations, the control valve 176 may be controlled by the controller 180 to turn gas on only when the reagents from the first reagent source 150 and/or the second reagent source 160 is flowing, such that usage of gas is minimized. For example, as illustrated by the dotted line between the two-way control valve 152 of the first reagent source 150 and the control valve 176 of the foreline gas injection kit 170, the control valve 176 may turn on (or off) in response to the two-way control valve 152 being turned on (or off).

The foreline 102 may be coupled to the vacuum source 190 or other suitable pumping apparatus. The vacuum source 190 is coupled with an exhaust line 192 that may be connected to a facility exhaust (not shown). The vacuum source 190 pumps the effluent from the processing chamber 110 to appropriate downstream effluent handling equipment, such as to a scrubber, incinerator or the like. In some implementations, the vacuum source 190 may be a backing pump, such as a dry mechanical pump or the like. The vacuum source 190 may have a variable pumping capacity which can be set at a chosen level, for example, to control or provide additional control of pressure in the foreline 102.

The controller 180 may be coupled to various components of the processing system 100 to control the operation thereof. For example, the controller may monitor and/or control the foreline gas injection kit 170, the reagent delivery system 140, and/or the plasma source 130 in accordance with the teachings disclosed herein.

The implementations of FIG. 1 are schematically represented and some components have been omitted for simplicity. For example, a high-speed vacuum pump, such as a turbo molecular pump or the like, may be disposed between the processing chamber 110 and the foreline 102 for removing effluent gases from the processing chamber 110. Additionally, other variants of components may be provided to supply the foreline gas, the reagent, and/or the plasma.

Figure 2:
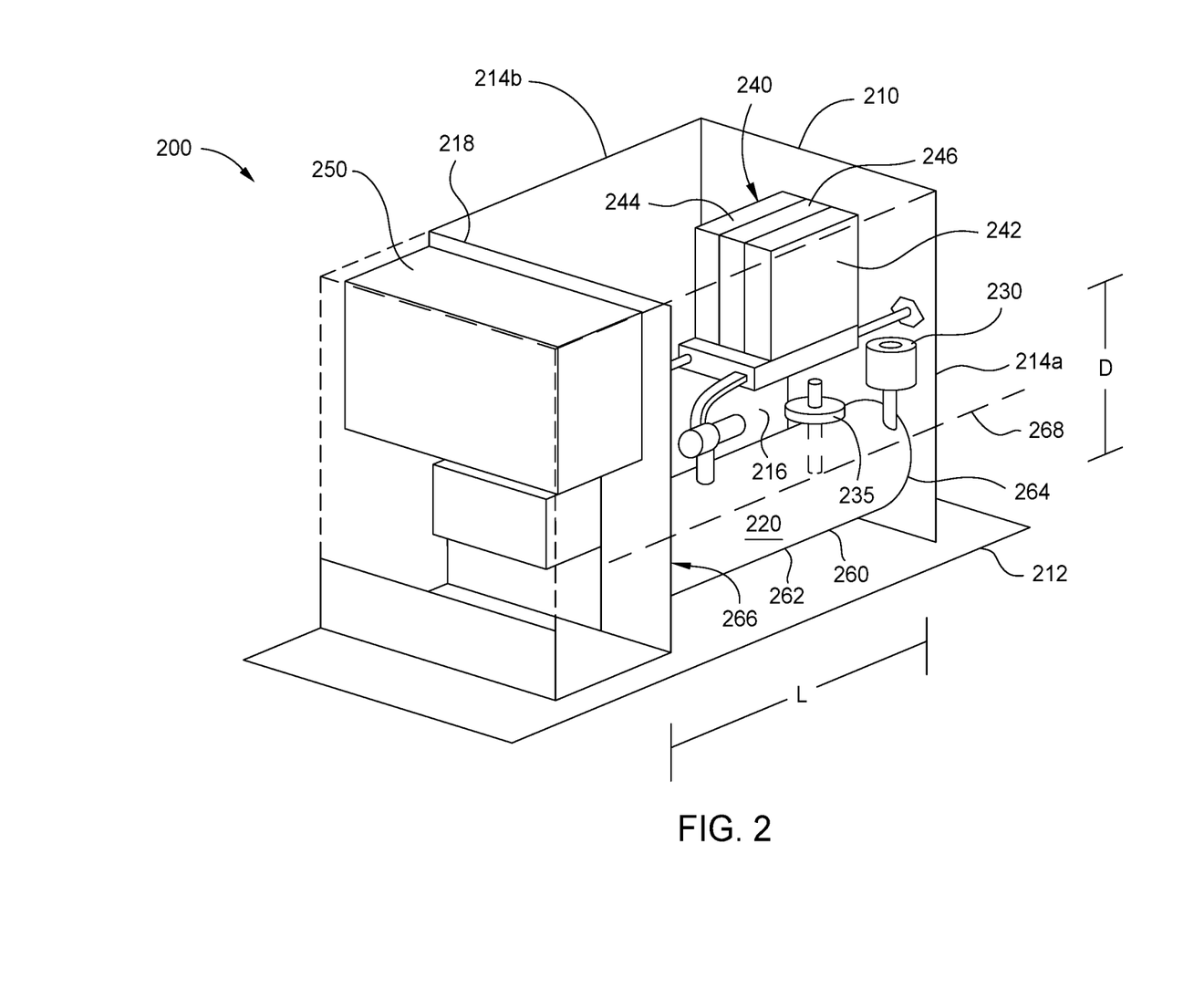
FIG. 2 is a partial perspective view of a water and oxygen delivery apparatus according to one or more implementations of the present disclosure.

FIG. 2 is a partial perspective view of a water and oxygen delivery apparatus 200 according to one or more implementations of the present disclosure. The water and oxygen delivery apparatus 200 is a water/oxygen delivery system, which may be used in the abatement system 120 described in FIG. 1. The water and oxygen delivery apparatus 200 may be used in place of the reagent delivery system 140 depicted in FIG. 1. The water and oxygen delivery apparatus 200 includes a housing 210 for enclosing the components of the water and oxygen delivery apparatus 200. The housing 210 includes a floor 212, an opposing ceiling (not shown), and a plurality of sidewalls 214a, 214b that define an enclosed region 216. The plurality of sidewalls 214a, 214b are positioned orthogonally relative to the floor 212. The floor 212 defines a horizontal plane. The housing 210 also includes an interior wall 218, which extends from the floor 212 to the ceiling and is parallel to the sidewall 214a. The sidewall 214a defines a vertical plane that is orthogonal to the horizontal plane defined by the floor 212.

The water and oxygen delivery apparatus 200 includes a water tank 220 positioned in a lower portion of the housing 210 or other enclosure. In one implementation, the water tank 220 is positioned on the floor 212 in the region defined by sidewall 214a, sidewall 214b, and interior wall 218. A heat source (not shown) is typically coupled with the water tank 220 for heating water in the tank to produce steam. In one implementation, the water tank 220 has a cylindrical body 260. The cylindrical body 260 has a cylindrical sidewall 262, a first wall 264 and an opposing second wall 266, which define the enclosed portion of the water tank 220. The longitudinal axis 268 of the cylindrical body 260 is parallel to the plane defined by the floor 212. The cylindrical sidewall 262 is parallel to the longitudinal axis 268. In one implementation, the first wall 264 and the second wall 266 are circular walls. In some implementations, the first wall 264 and the second wall 266 are perpendicular to the plane defined by the floor 212.

The water tank 220 has a length "L" (e.g., the length of the cylindrical sidewall 262) that is greater than a diameter "D" (e.g., the diameter of either the first wall 264 or the second wall 266). In one implementation, the length "L" of the water tank 220 is 1.5 times or greater than the diameter "D" of the water tank 220. In another implementation, the length "L" of the water tank 220 is 2 times or greater than the diameter "D" of the water tank 220. In yet another implementation, the length "L" of the water tank 220 is 2.5 times or greater than the diameter "D" of the water tank 220. In yet another implementation, the length "L" of the water tank 220 is 3 times or greater than the diameter "D" of the water tank 220. It has been found by the inventors that positioning the water tank 220 horizontally (e.g., with the longitudinal axis 268 parallel to the plane defined by the floor 212) increases the surface area of water in the water tank 220, which leads to increased steam generation relative to a vertically positioned tank (e.g., with the longitudinal axis 268 perpendicular to the plane defined by the floor 212). Although the water tank 220 is described as being cylindrical, it should be understood that the water tank 220 may comprise other shapes.

In some implementations, the water tank 220 is a low-pressure boiler for producing water vapor. A liquid abating agent, such as liquid water, is typically disposed in the low-pressure boiler. Alternatively, the water tank 220 may be a flash evaporator capable of turning liquid water into water vapor.

In some implementations, the water and oxygen delivery apparatus 200 further includes a vacuum pressure gauge 230 positioned in the water tank 220 for measuring the pressure within the water tank 220. The water and oxygen delivery apparatus 200 may further include a liquid level sensor 235 positioned in the water tank 220 for measuring the liquid level in the water tank 220.

The water and oxygen delivery apparatus 200 further includes a flow control system 240 for controlling the flow of water vapor and the flow of oxygen-containing gases. The flow control system 240 is positioned above the horizontal water tank 220 within the housing 210. In some implementations, the flow control system 240 includes a first mass flow controller 242 for controlling the flow of water vapor from the water tank 220. The flow control system 240 may further include a second mass flow controller for controlling the flow of oxygen-containing gas. The flow control system 240 may further include a water vapor MFC controller 246 positioned between the first mass flow controller 242 and the second mass flow controller 244. The water and oxygen delivery apparatus 200 may include other components (e.g., valves, MFCs, etc.) for controlling the generation and flow of water vapor and oxygen which are not described for the sake of brevity. The apparatus further includes an electronic controller 250, which may control and monitor the generation of water vapor from the water tank 220, the vacuum pressure gauge 230, the liquid level sensor 235, and the flow control system 240.

The electronic controller 250 can be, for example, a computer, a programmable logic controller, or an embedded controller. The electronic controller 250 typically includes a central processing unit (CPU) (not shown), memory (not shown), and support circuits for inputs and outputs (I/O) (not shown). The CPU may be one of any form of computer processors that are used in industrial settings for controlling various system functions, substrate movement, chamber processes, and control support hardware (e.g., sensors, motors, heaters, etc.), and monitor the processes performed in the system. The memory is connected to the CPU, and may be one or more of a readily available non-volatile memory, such as random access memory (RAM), flash memory, read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the electronic controller 250 determines which tasks are performable by the components in the water and oxygen delivery apparatus 200. The program may be software readable by the electronic controller 250 that includes code to perform tasks relating to the delivery of oxygen and water vapor to the abatement system.

Figure 3:
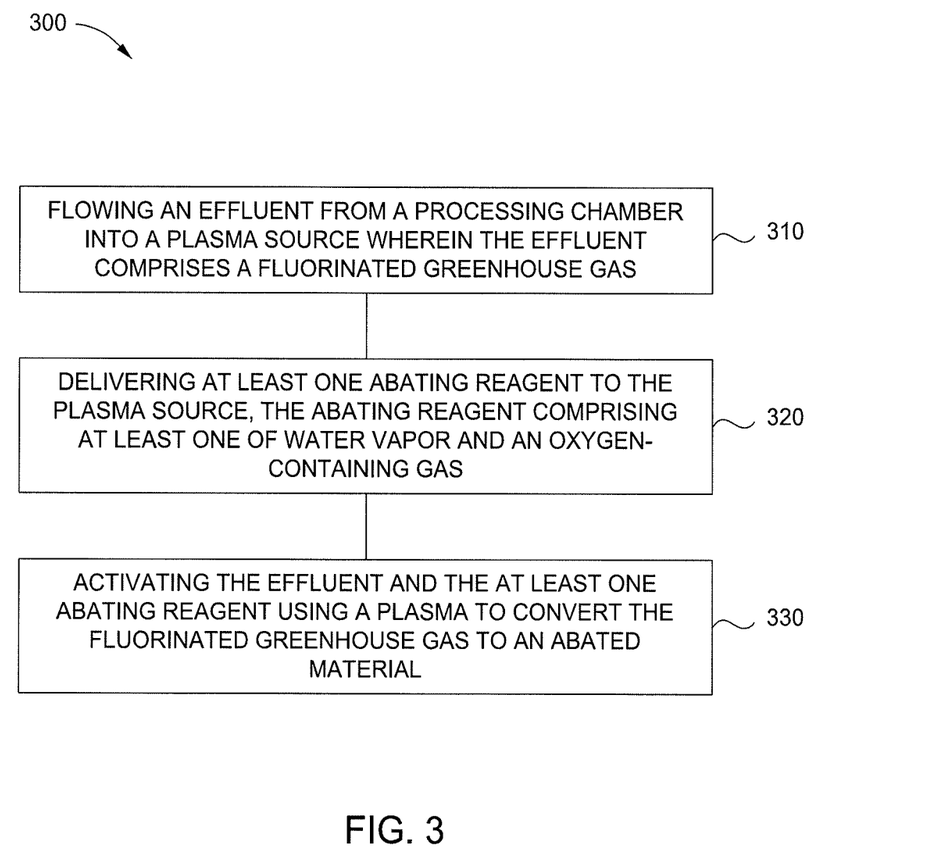
FIG. 3 is a flow diagram of one implementation of a method for abating effluent exiting a processing chamber.

FIG. 3 is a flow diagram of one implementation of a method 300 for abating effluent exiting a processing chamber. The method 300 begins by flowing an effluent from a processing chamber, such as the processing chamber 110, into a plasma source, such as plasma source 130, wherein the effluent comprises one or more F-gases, at operation 310. The method further includes delivering at least one abating reagent to the plasma source, the abating reagent comprising at least one of water vapor and oxygen-containing gas, at operation 320. The method further includes activating the effluent and the abating reagent in the presence of a plasma to convert the one or more F-gases in the effluent and the abating reagent to an abated material, at operation 330. In some implementations, at least some of the abating reagent and/or material entrained in the effluent are at least partially disassociated. The target material in the effluent is converted to an abated material in the presence of the plasma including the abating reagent formed in the plasma source. The material in the effluent may then exit the plasma source and flow into the vacuum source, such as vacuum source 190, and/or be further treated.

In one exemplary implementation of the method disclosed herein, effluent containing undesirable material exiting from the processing chamber 110 enters the plasma source 130. The effluent can include one or more F-gases, which can be a carbon-containing gas, a nitrogen-containing gas or a sulfur-containing gas. In one implementation, the one or more F-gases is a gas selected from the group comprising or consisting of $CF_4$, $CH_3F$, $CH_2F_2$, $CH_4$, $C_2F_6$, $C_3F_8$, $C_4F_{10}$, $CHF_3$, $SF_6$, and $NF_3$. Combinations of the above-described F-gases may be present in the effluent. In some implementations, a water vapor and oxygen ratio is determined by establishing a chosen water vapor only flow rate (e.g., X sccm) and a chosen oxygen only flow rate (e.g., Y sccm) and then applying a "balanced" flow method to vary the water vapor and oxygen in between. For example, a "lean water" configuration at "25% water vapor" would be equal to a mixture of 0.25×X+0.75×Y, a "lean oxygen" setting would be 0.75×X+0.25×Y, and a "balanced mixture" would be 0.5×X+0.5×Y. In one implementation, an abating reagent with a water vapor to oxygen flow ratio of at least a 2.5:1, such as a water vapor to oxygen gas, enters the plasma source 130. A plasma is generated from the abating reagent within the plasma source 130, thus energizing the abating reagent, and in some implementations, also energizing the effluent. In some implementations, at least some of the abating reagent and/or material entrained in the effluent are at least partially disassociated. The identity of the abating reagent, the flow rate of the abating reagent, the foreline gas injection parameters, and the plasma generation conditions may be determined based on the composition of the material entrained in the effluent and may be controlled by the controller 180. In an implementation where the plasma source 130 is an inductively coupled plasma source, dissociation may involve several kW of power.

The method 300 begins by flowing an effluent from a processing chamber into a plasma source, wherein the effluent comprises one or more F-gases, at operation 310. Effluent containing materials chosen for abatement, such as F-gases compounds, is flowed into the plasma source 130. In one example, the exhaust gas may have originated at the processing chamber 110 and resulted from performing any of a number of processes, such as etching, deposition, cleaning, or the like. The reagent gas may be injected into the foreline 102, for example, by the reagent delivery system 140 or the water and oxygen delivery apparatus 200.

An abating reagent can be delivered to the plasma source, at operation 320. In one exemplary abatement process using water vapor (e.g., $H_2O$) and $O_2$, water vapor and $O_2$ from the reagent delivery system 140 is flowed into the plasma source 130. In one implementation, $O_2$ is delivered simultaneously with water vapor ($H_2O$). The abating reagent has a water vapor to oxygen flow ratio of at least 2.5:1, such as a water vapor to oxygen flow ratio of at least 3:1. In one implementation, the water vapor to oxygen flow ratio is from about 3:1 to about 10:1. The abating reagent can further include combinations of gases to achieve the chosen water vapor to oxygen flow ratio.

Figure 4:
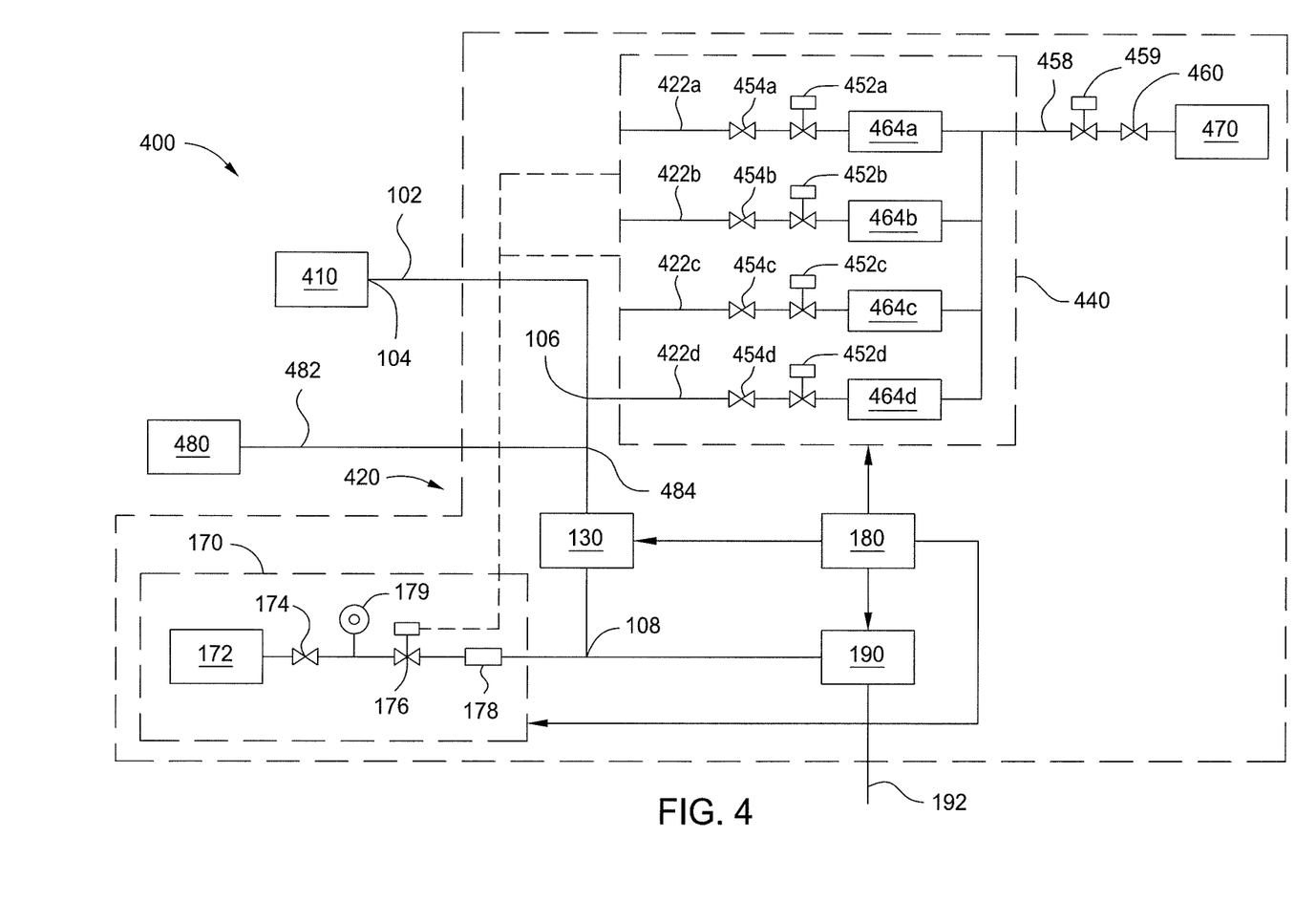
FIG. 4 is a schematic diagram of another processing system according to one or more implementations of the present disclosure.

FIG. 4 is a schematic diagram of another processing system 400 according to one or more implementations of the present disclosure. The processing system 400 is similar to the processing system 100 except that the abatement system 120 of the processing system 100 is replaced by the abatement system 420. The abatement system 420 includes a reagent delivery system 440, which includes a flow control device 464a-464d (collectively 464) for controlling the flow of an oxygen-containing reagent into a chamber foreline. The flow control device 464 may be any suitable active or passive flow control device, such as a fixed orifice, mass flow controller, needle valve or the like. The oxygen-containing reagent may be delivered by an oxygen-containing reagent source 470, for example, $O_2$. The $O_2$ may be used when abating effluent containing, for example, $CF_4$ and/or other materials.

As shown in FIG. 4, the processing system 400 includes one or more processing chamber(s) 410 coupled with the abatement system 420. The processing chamber(s) 410 has a chamber exhaust port 104 coupled to a foreline 102 of the abatement system 120. A throttle valve (not shown) may be placed proximate the chamber exhaust port 104 for controlling the pressure inside the processing chamber(s) 410. The first injection port 106 and the second injection port 108 may be formed in the foreline 102. The abatement system 420 further includes the vacuum source 190 coupled to the second end of the foreline 102. The plasma source 130 is coupled in the foreline 102 at a location between the first injection port 106 and the vacuum source 190.

The reagent delivery system 440 delivers one or more oxygen-containing reagents, to the foreline 102 upstream of the plasma source 130. In an alternative implementation, the reagent delivery system 440 may be coupled directly to the plasma source 130 for delivering oxygen-containing reagents directly into the plasma source 130. The reagent delivery system 440 is coupled with the oxygen-containing reagent source 470, which is coupled with the flow control device 464a-464d. Each of the flow control devices 464a-464d is coupled with a foreline or a plasma source, such as the foreline 102 (or the plasma source 130) via a first conduit 422a-422d (collectively 422). The reagent delivery system 440 may also be coupled with the first injection port 106 via a first conduit 422d. It should be understood that each of the first conduits 422a-422d may each be coupled to a separate processing system for delivering oxygen to the foreline of a separate processing chamber. For example, the reagent delivery system 440 includes four separate flow control devices 464a-464d (collectively 464) each of which is capable of delivering oxygen to separate processing chambers.

The oxygen-containing reagent source 470 is coupled with the flow control device 464a-464d via a third conduit 458. One or more valves 459 and/or pressure regulators 460 may be positioned along the third conduit 458 for controlling the flow of oxygen from the oxygen-containing reagent source 470 to the reagent delivery system 440. The pressure regulator 460 may be used to measure and control pressure downstream of the flow control device 464. Each pressure regulator may be coupled with a pressure gauge (not shown) to measure pressure, which may be utilized by a control device, such as a controller 180, discussed below, to set the pressure upstream of the flow control device 464 by controlling the pressure regulator 460.

One or more valves may be positioned along each of the first conduits 422a-422d between the flow control device 464a-464d and a first injection port, for example, the first injection port 106. For example, in some implementations, a valve scheme may include a two-way control valve 452a-452d (collectively 452), which functions as an on/off switch for controlling the flow from the oxygen-containing reagent source 470 into the foreline 102, and/or a pressure regulator 454a-454d (collectively 454). The flow control device 464 may be disposed upstream of the two-way control valve 452 and the foreline 102. The two-way control valve 452 may be any suitable control valve, such as a solenoid valve, pneumatic valve, needle valve or the like. The flow control device 464 may be any suitable active or passive flow control device, such as a fixed orifice, mass flow controller, needle valve or the like.

In another implementation, the processing system 400 further includes a water vapor delivery system 480 coupled with the abatement system 420. In one implementation, the water vapor delivery system 480 is coupled with the abatement system 420 via a conduit 482. As shown in FIG. 4, in one implementation, the water vapor delivery system 480 is coupled with the foreline 102. The water vapor delivery system 480 may be coupled with the foreline 102 via an injection port 484. In operation, the water vapor delivery system 480 delivers water vapor into the foreline 102, which combines with the oxygen-containing gas delivered from the reagent delivery system 440 to form an abating reagent. The effluent and abating reagent are then activated in the presence of a plasma to convert the one or more F-gases in the effluent and the abating reagent to an abated material. Thus, the processing system 400 of FIG. 4 may be used to create processing conditions similar to the processing conditions of FIG. 1. However, the reagent delivery system 440 may be combined with an already existing water delivery system, such as the water vapor delivery system 480 as a retrofit, to use existing water delivery systems for water vapor delivery and add both water and oxygen to the inlet from separate modules.

The implementations of FIG. 4 are schematically represented and some components have been omitted for simplicity. For example, a high-speed vacuum pump, such as a turbo molecular pump or the like, may be disposed between the processing chamber 110 and the foreline 102 for removing effluent gases from the processing chamber 110. Additionally, other variants of components may be provided to supply the foreline gas, the reagent, and/or the plasma.

The previously described implementations have many advantages. For example, the techniques disclosed herein can convert volatile, toxic, and/or explosive effluent into much more benign chemicals that can be more safely handled. The plasma abatement process is beneficial to human health in terms of acute exposure to the effluent by workers and by conversion of pyrophoric or toxic materials into more environmentally friendly and stable materials. The plasma abatement process also protects semiconductor-processing equipment, such as, for example, vacuum pumps, from excessive wear and premature failure by avoiding the generation of particulates and/or other corrosive materials from the effluent stream. Moreover, performing the abatement technique on the vacuum foreline adds additional safety to workers and equipment. If an equipment leak occurs during the abatement process, the low pressure of the effluent relative to the outside environment prevents the effluent from escaping the abatement equipment. Additionally, many of the abating reagents disclosed herein are low-cost and versatile. For example, water vapor (e.g., $H_2O$) and $O_2$, as used in the abatement of F-gases are both versatile and low-cost. The aforementioned advantages are illustrative and not limiting. It is not necessary for all implementations to have all the advantages.

In summary, some benefits of the some of the implementations described herein include a combined water and oxygen delivery system that either simultaneously or sequentially provides water vapor and oxygen in a plasma abatement system. In some implementations, the combined water and oxygen delivery system provides a cost-effective way of reducing high global-warming potential of the gaseous chemicals used in semiconductor processing, which includes F-gases such as PFCs and $SF_6$. In some implementations, the combined water and oxygen delivery system enables optimization of fluorinated greenhouse gas abatement, while at the same time yielding minimum solid and undesirable gaseous by-products that may be generated when using just water vapor only, or oxygen only. Additionally, in some implementations described herein, the combined water and oxygen delivery system provides a pre-pump plasma abatement solution that uses less energy by treating the actual process gas volume, which is a smaller volume than that which is typically treated by post-pump abatement systems. Further, the combined water and oxygen delivery system described herein can be installed within the pump footprint of currently available semiconductor processing chamber.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method comprising:
    flowing an effluent from a processing chamber through a foreline into a plasma source, wherein the effluent comprises a fluorinated greenhouse gas;
    delivering an abating reagent comprising water vapor and oxygen into the plasma source via the foreline, wherein delivering the abating reagent, comprises:
        delivering the water vapor from a first reagent source into the foreline via a first conduit fluidly coupled with the foreline; and
        delivering the oxygen from a second reagent source into the foreline via a second conduit fluidly coupled with the first conduit; and
    activating the effluent and the abating reagent using a plasma formed by the plasma source to convert the fluorinated greenhouse gas to an abated material.

2. The method of claim 1, wherein the water vapor ("X") and the oxygen ("Y") in the abating reagent have a ratio between 0.75X:0.25Y and 0.5X:0.5Y.

3. The method of claim 1, wherein the fluorinated greenhouse gas comprises a sulfur-containing gas.

4. The method of claim 3, wherein the sulfur-containing gas is $SF_6$.

5. The method of claim 1, wherein the plasma is an inductively coupled plasma.

6. The method of claim 1, wherein the abating reagent and the effluent are combined prior to forming the plasma.

7. The method of claim 1, wherein the water vapor and oxygen are simultaneously delivered to the plasma source.

8. The method of claim 1, wherein the processing chamber is a plasma enhanced chemical vapor deposition (PECVD) chamber, a chemical vapor deposition (CVD) chamber, or a physical vapor deposition (PVD) chamber.

9. A method comprising:
    flowing an effluent comprising a fluorinated greenhouse gas from a processing chamber through a foreline and into a plasma source, wherein the foreline fluidly couples the processing chamber and the plasma source;
    delivering an abating reagent to the plasma source via the foreline, the abating reagent comprising water vapor and oxygen, wherein the water vapor ("X") and the oxygen ("Y") have a ratio between 0.75X:0.25Y and 0.5X:0.5Y, wherein delivering the abating reagent, comprises:
        delivering the water vapor from a first reagent source into the foreline via a first conduit fluidly coupled with the foreline; and
        delivering the oxygen from a second reagent source into the foreline via a second conduit fluidly coupled with the first conduit; and
    forming an inductively coupled plasma from the effluent and the abating reagent creating an abated material.

10. The method of claim 9, wherein the fluorinated greenhouse gas comprises a sulfur-containing gas.

11. The method of claim 10, wherein the sulfur-containing gas is $SF_6$.

12. The method of claim 9, wherein the abating reagent and the effluent are combined prior to forming the inductively coupled plasma.

13. The method of claim 9, wherein the processing chamber is a plasma enhanced chemical vapor deposition (PECVD) chamber, a chemical vapor deposition (CVD) chamber, or a physical vapor deposition (PVD) chamber.

14. The method of claim 9, wherein the water vapor and oxygen are simultaneously delivered to the plasma source.

15. A method comprising:
    flowing an effluent from a processing chamber into a plasma source via a foreline, wherein the effluent comprises a fluorinated greenhouse gas and the foreline fluidly couples the processing chamber and the plasma source;
    delivering water vapor from a first reagent source into the plasma source via a first conduit, wherein the first conduit fluidly couples the foreline and the first reagent source;
    delivering oxygen from a second reagent source into the plasma source via the first conduit,
        wherein a second conduit fluidly couples the second reagent source with the first conduit and the foreline, and
        wherein the first reagent source and the second reagent source are positioned in a housing; and
    activating the effluent, the water vapor, and the oxygen using a plasma to convert the fluorinated greenhouse gas to an abated material.

16. The method of claim 15, wherein the water vapor ("X") and the oxygen ("Y") have a ratio between 0.75X:0.25Y and 0.5X:0.5Y.

17. The method of claim 15, wherein the fluorinated greenhouse gas comprises a sulfur-containing gas.

18. The method of claim 17, wherein the sulfur-containing gas is $SF_6$.

19. The method of claim 15, wherein the plasma is an inductively coupled plasma.

20. The method of claim 15, wherein the water vapor, oxygen, and effluent are combined prior to forming the plasma.

* * * * *